(12) United States Patent
Johnston et al.

(10) Patent No.: US 7,862,391 B2
(45) Date of Patent: Jan. 4, 2011

(54) SPRING CONTACT ASSEMBLY

(75) Inventors: Charles J. Johnston, Chino Hills, CA (US); Scott Chabineau, Pomona, CA (US); Valts Treibergs, White Bear Township, MN (US); Sergey Yakushev, Maple Grove, MN (US); Mark Swart, Villa Park, CA (US); Edward A. Kottmeyer, Saint Paul, MN (US)

(73) Assignee: Delaware Capital Formation, Inc., Wilmington, DE (US)

( * ) Notice: Subject to any disclaimer, the term of this patent is extended or adjusted under 35 U.S.C. 154(b) by 135 days.

(21) Appl. No.: 12/206,659

(22) Filed: Sep. 8, 2008

(65) Prior Publication Data

US 2009/0075529 A1  Mar. 19, 2009

Related U.S. Application Data

(60) Provisional application No. 60/973,370, filed on Sep. 18, 2007, provisional application No. 61/080,607, filed on Jul. 14, 2008.

(51) Int. Cl.
*H01R 13/24* (2006.01)
(52) U.S. Cl. .......................... 439/824; 439/66; 439/908
(58) Field of Classification Search ............. 439/66, 439/82, 591, 700, 751, 824, 908, 943
See application file for complete search history.

(56) References Cited

U.S. PATENT DOCUMENTS

| 4,029,375 | A | 6/1977 | Gabrielian |
| 5,174,763 | A | 12/1992 | Wilson |
| 5,227,718 | A | 7/1993 | Stowers et al. |
| 5,362,241 | A | 11/1994 | Matsuoka et al. |
| 5,391,995 | A | 2/1995 | Johnston et al. |
| 5,942,906 | A | 8/1999 | Stowers et al. |
| 6,159,056 | A | 12/2000 | Boyle |
| 6,396,293 | B1 * | 5/2002 | Vinther et al. ............... 324/761 |
| 6,462,567 | B1 | 10/2002 | Vinther et al. |
| 6,506,082 | B1 * | 1/2003 | Meek et al. .................. 439/700 |
| 6,716,043 | B2 * | 4/2004 | Ishizuka ..................... 439/131 |
| 6,769,919 | B2 | 8/2004 | Kosmala |

(Continued)

FOREIGN PATENT DOCUMENTS

EP  0 838 878 A1  4/1998

(Continued)

OTHER PUBLICATIONS

Partial Translations for Cite Nos. 1 and 3-13, listed under Foreign Patent Documents, pp. 3-8.

(Continued)

*Primary Examiner*—Tho D Ta
*Assistant Examiner*—Travis Chambers
(74) *Attorney, Agent, or Firm*—Christie, Parker & Hale, LLP

(57) ABSTRACT

A spring contact assembly having a first plunger with a tail portion having a flat contact surface and a second plunger having a tail portion with a flat contact surface wherein the flat contact surfaces are overlapping and are surrounded by an external compression spring such that the sliding engagement of the flat surfaces increases during compression of the spring.

18 Claims, 15 Drawing Sheets

U.S. PATENT DOCUMENTS

| | | |
|---|---|---|
| 6,821,131 B2 | 11/2004 | Suzuki et al. |
| 6,992,496 B2 | 1/2006 | Winter et al. |
| 7,025,602 B1 * | 4/2006 | Hwang .................. 439/66 |
| 7,148,713 B1 | 12/2006 | Meek et al. |
| 7,154,286 B1 | 12/2006 | Marx et al. |
| 7,157,922 B2 | 1/2007 | Kazama |
| 7,256,593 B2 * | 8/2007 | Treibergs ............... 324/754 |
| 7,315,176 B2 * | 1/2008 | Nelson et al. ........... 324/761 |
| 7,559,806 B2 * | 7/2009 | Lin et al. ............... 439/700 |
| 2009/0189622 A1 * | 7/2009 | Tan ....................... 324/754 |

FOREIGN PATENT DOCUMENTS

| | | |
|---|---|---|
| JP | 62-157576 | 7/1987 |
| JP | 2000-28638 | 1/2000 |
| JP | 2002-15804 | 1/2002 |
| JP | 2002-56915 | 2/2002 |
| JP | 2003-43065 | 2/2003 |
| JP | 2004-152495 | 5/2004 |
| JP | 2008-69805 | 3/2005 |
| JP | 2006-71343 | 3/2006 |
| JP | 2006-292456 | 10/2006 |
| JP | 2006-310025 | 11/2006 |

OTHER PUBLICATIONS

Patent Abstract for European Publication No. JP 62-157576, retrieved from *esp@cenet* on Aug. 28, 2008.

Patent Abstract for European Publication No. EP 0 838 878 A1, retrieved from *esp@cenet* on Aug. 28, 2008.

Patent Abstracts of Japan, Publication No. 2000-028638, Date of Publication Jan. 28, 2000, in the name of Kazama.

Patent Abstracts of Japan, Publication No. 2002-015804, Date of Publication Jan. 18, 2002, in the name of Sakamoto et al.

Patent Abstracts of Japan, Publication No. 2002-056915, Date of Publication Feb. 22, 2002, in the name of Kurokawa et al.

Patent Abstracts of Japan, Publication No. 2003-043065, Date of Publication Feb. 13, 2003, in the name of Muta et al.

Patent Abstracts of Japan, Publication No. 2004-152495, Date of Publication May 27, 2004, in the name of Suzuki et al.

Patent Abstracts of Japan, Publication No. 2005-069805, Date of Publication Mar. 17, 2005, in the name of Miyazawa.

Patent Abstracts of Japan, Publication No. 2006-071343, Date of Publication Mar. 16, 2006, in the name of Akiyama.

Patent Abstracts of Japan, Publication No. 2006-292456, Date of Publication Oct. 26, 2006, in the name of Ishimaru.

Patent Abstracts of Japan, Publication No. 2006-310025, Date of Publication Nov. 9, 2006, in the name of Kishi et al.

International Search Report and Written Opinion for Application No. PCT/US08/76720; date mailed Nov. 24, 2008; search and opinion completed Nov. 15, 2008; 7 pages.

* cited by examiner

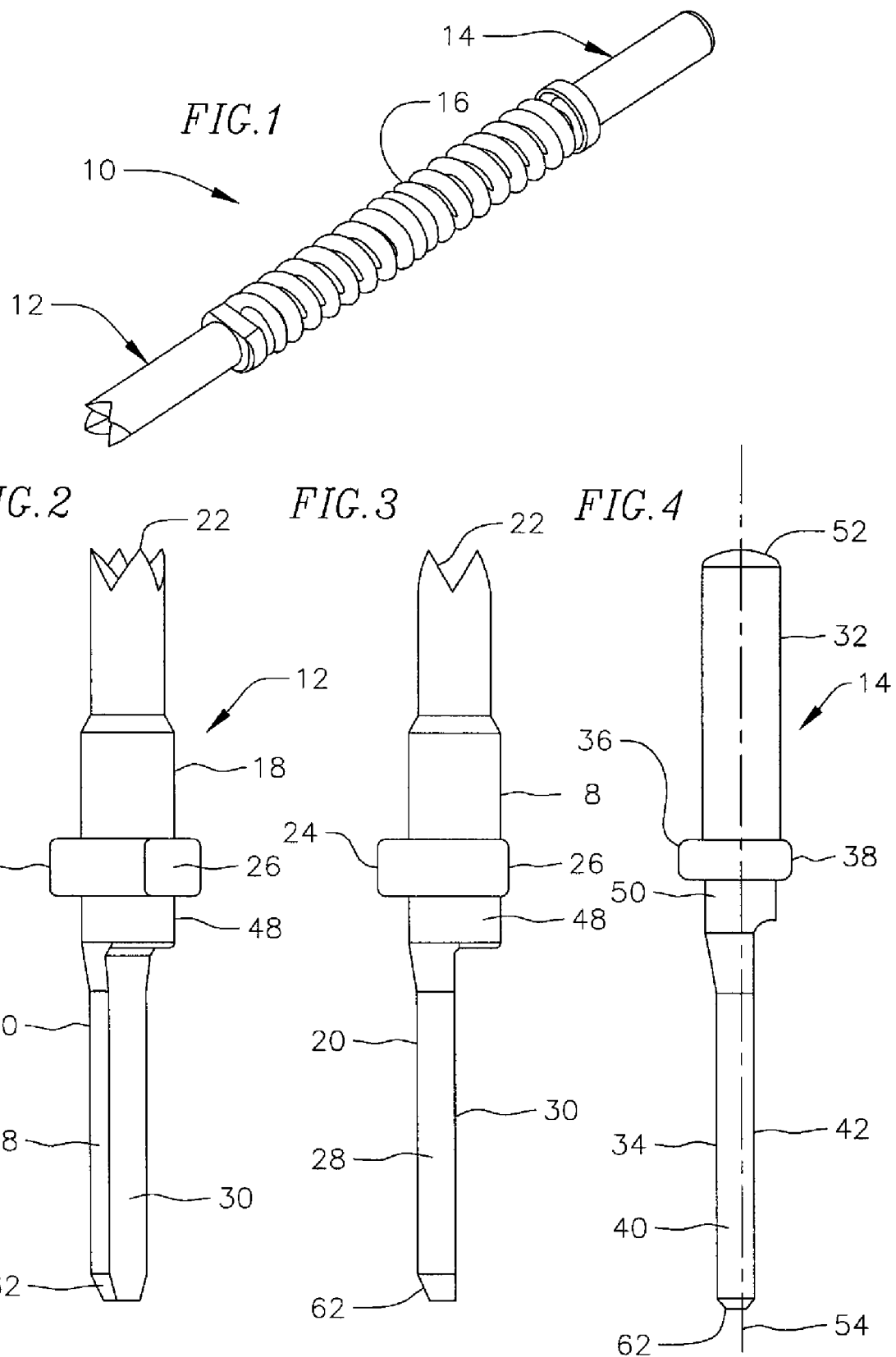

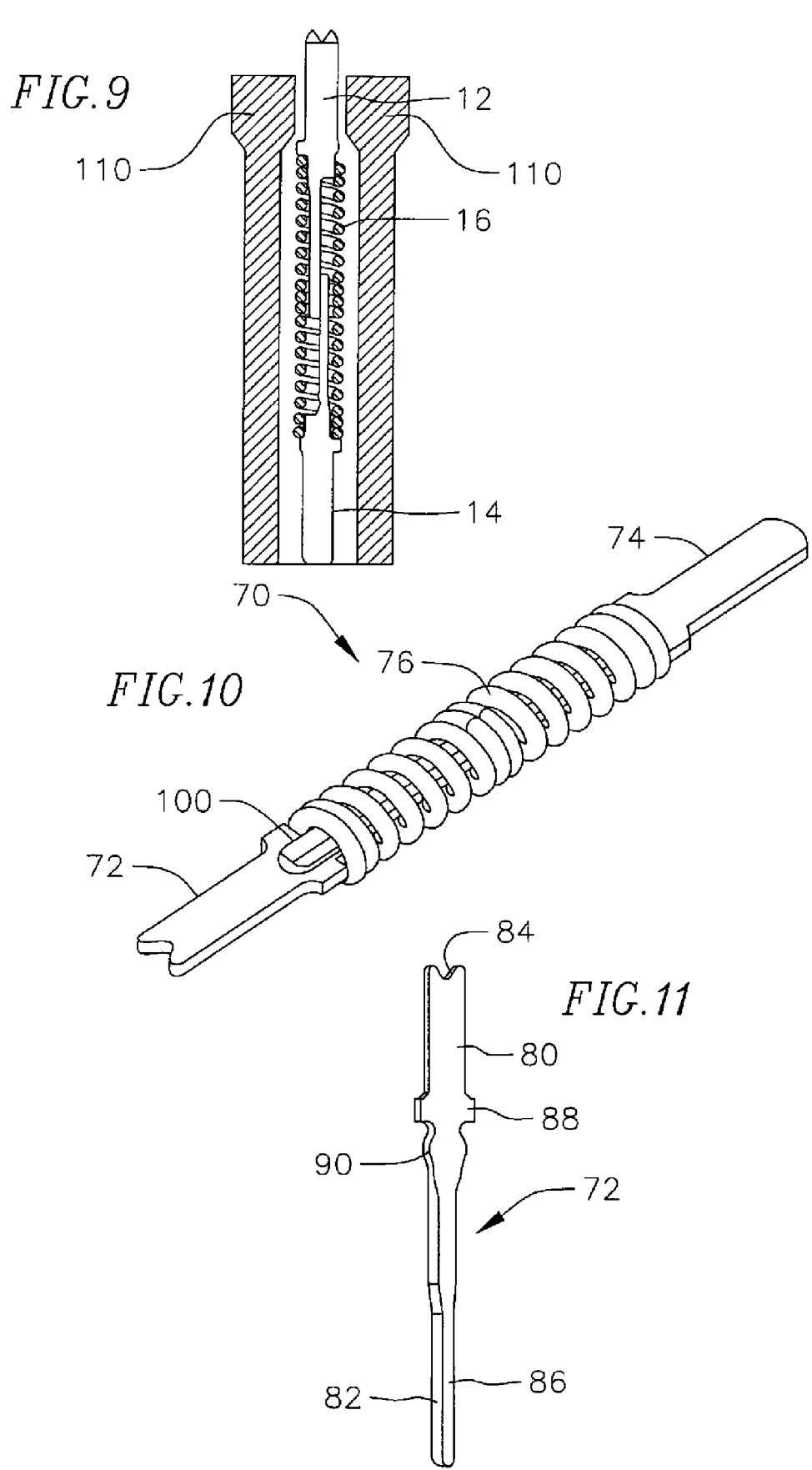

FIG.12
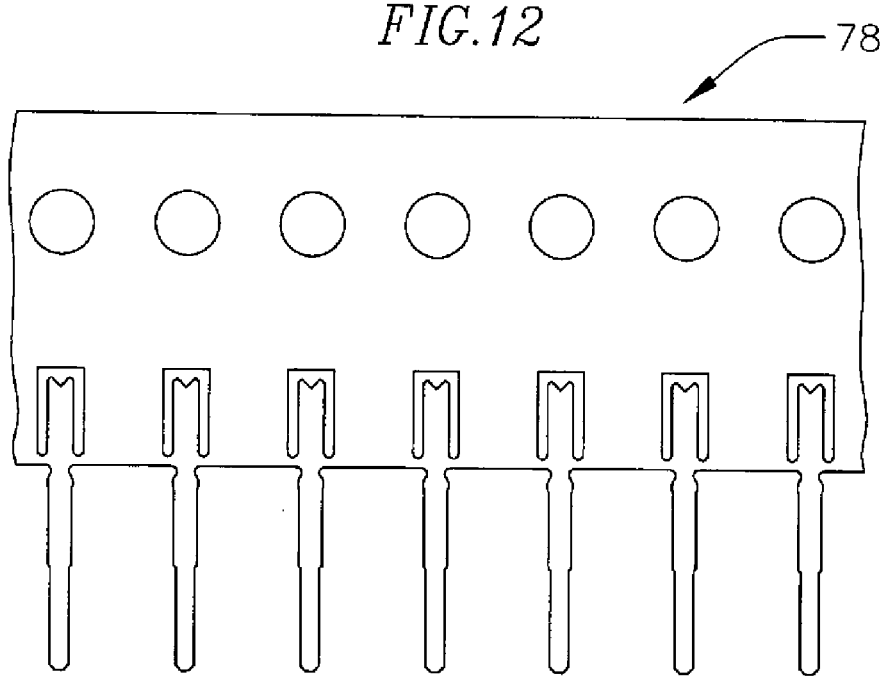
FIG.13
FIG.14
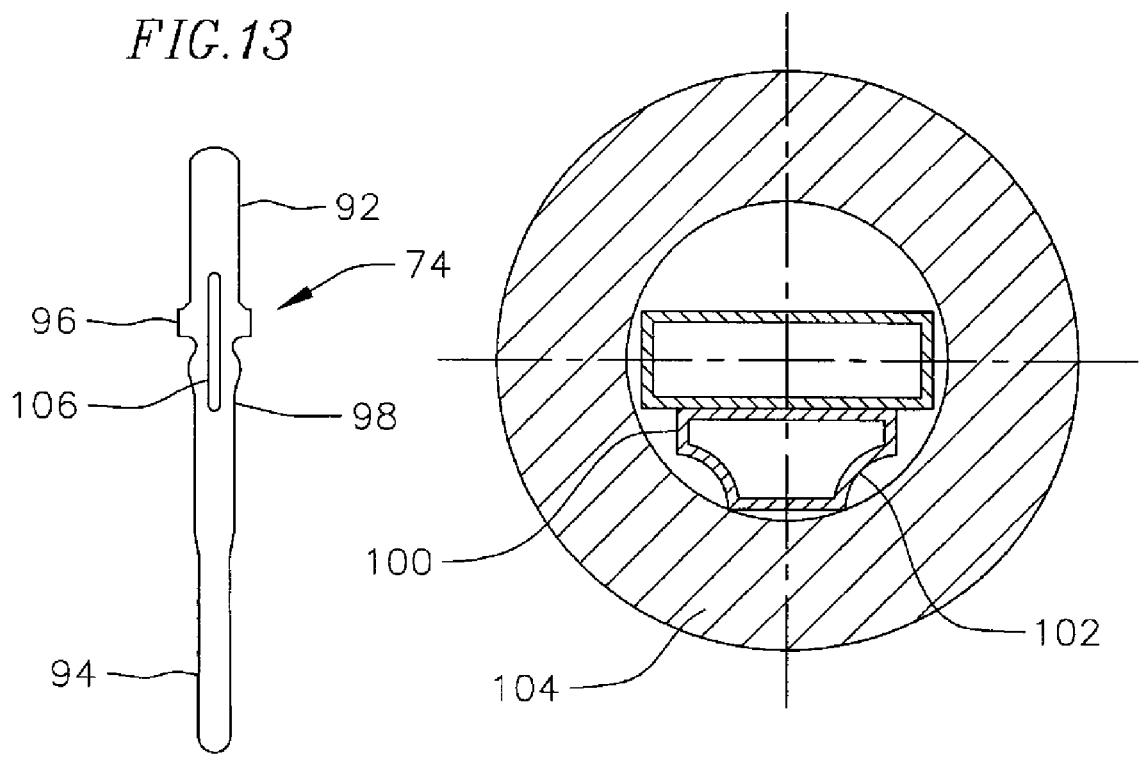

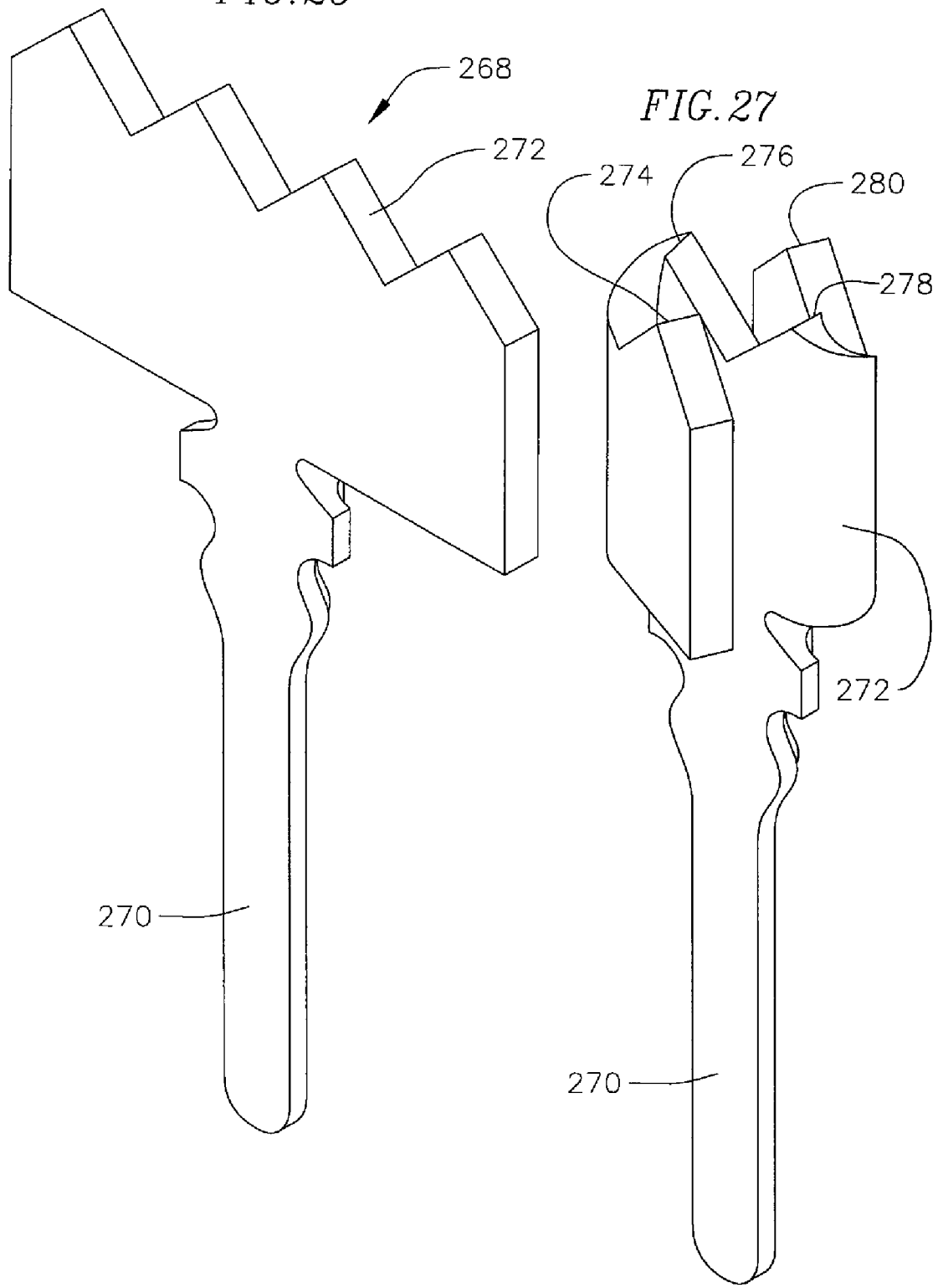

SPRING CONTACT ASSEMBLY

CROSS-REFERENCE TO RELATED APPLICATION(S)

This application claims priority to U.S. Provisional Application Nos. 60/973,370 filed Sep. 18, 2007 and 61/080,607 filed Jul. 14, 2008.

FIELD OF THE INVENTION

The present invention relates to electrical contact probes forming electrical interconnects and, more particularly, to a spring contact assembly having two movable and overlapping plungers having flat contact surfaces surrounded by an external spring.

BACKGROUND OF THE INVENTION

Conventional spring loaded contact probes generally include a movable plunger and a barrel having an open end for containing an enlarged diameter section of the plunger, and a spring for biasing the travel of the plunger in the barrel. The plunger bearing slidably engages the inner surface of the barrel. The enlarged bearing section is retained in the barrel by a crimp near the barrel open end. The plunger is commonly biased outwardly, a selected distance by the spring and may be biased or depressed inwardly into the barrel, a selected distance, under force directed against the spring. Axial and side biasing of the plunger against the barrel prevents false opens or intermittent points of no contact between the plunger and the barrel. The plunger generally is solid and includes a head or tip for contacting electrical devices under test. The barrel may also include a tip opposite the barrel's open end.

The barrel, plunger and tips form an electrical interconnect between the electrical device under test and test equipment and as such, are manufactured from an electrically conductive material. Typically the probes are fitted into cavities formed through the thickness of a test plate or socket. Generally a contact side of the electrical device to be tested, such as an integrated circuit, is brought into pressure contact with the tips of the plungers protruding through one side of the test plate or test socket for manufacturing spring pressure against the electrical device. A contact plate connected to the test equipment is brought to contact with the tips of the plungers protruding from the other side of the test plate or test socket. The test equipment transmits signals to the contact plate from where they are transmitted through the test probe interconnects to the device being tested. After the electrical device has been tested, the pressure exerted by the spring probes is released and the device is removed from contact with the tip of each probe.

The process of making conventional spring probes involves separately producing the compression spring, the barrel and the plunger. The compression spring is wound and heat treated to produce a spring of a precise size and of a controlled spring force. The plunger is typically turned on a lathe and heat treated. The barrels are also sometimes heat treated. The barrels can be formed in a lathe or by a deep draw process. All components may be subjected to a plating process to enhance conductivity. The spring probe components are assembled either manually or by an automated process.

An important aspect of testing integrated circuits is that they are tested under high frequencies. As such impedance matching is required between the test equipment and the integrated circuit so as to avoid attenuation of the high frequency signals. Considering that spacing within a test socket is minimal, in order to avoid attenuation of the high frequency signals, the length of the electrical interconnect formed by the probes must be kept to a minimum. To address this problem external spring probes have been developed having a shorter length than conventional probes. External spring probes consist of two separate sections each having a tip and a flange. A contact component extends from each probe section opposite the tip. The two contact components contact each other and the spring is sandwiched between two flanges that surround the contact components. Typically the first contact component is a barrel while the second contact component is a bearing surface. The bearing surface is slidably engaged to the inner surface of the barrel. These probes are fitted into cavities formed in the test sockets used during testing. A problem associated with these type of external spring probes is the expense to manufacture due to costly machining operations.

In response thereto external spring probes were designed having flat components which can be produced less expensively by stamping. Typically these designs incorporate two components which are connected orthogonally and the electrical path between the two components is through a protruding end surface. A problem with this design is that the components wear out rather quickly and have a short life span requiring constant replacement.

Consequently a need exists for a new spring contact assembly design that is less expensive to manufacture.

SUMMARY OF THE INVENTION

The present invention is directed to a spring contact assembly having two movable and overlapping contact members or plungers surrounded by an external spring. Each plunger has a contact portion and a tail portion wherein the tail portion has a flat surface that passes over and makes contact with an opposing plunger tail portion inside the spring when assembled. The spring has end coils that press onto each of the opposing plungers to prevent the plungers from separating from the spring, thus fixing the plunger contact portion and the tail portions with respect to each end of the spring. Utilizing the natural torsional movement of the spring while it is compressed, the flat surfaces of the plunger tail portions maintain contact throughout the compression stroke of the contact assembly. The contact between the opposing flat sections prevents the twisting or torsional movement of the spring from translating to the tips on the contact portions. The opposition to the natural twisting enhances the electrical conductivity of the components, which in turn improves performance of the spring contact assembly. The spring can also have reduced diameter coil sections along the length of the spring to further constrain the plunger tails and enhance the interaction between the two plungers, or further biasing effect can be created by adding an offset coil section in the spring.

The flat surface on the tail portion of the plunger would normally be formed parallel at the midline of the cylindrical tail portion diameter for each plunger. In an alternative embodiment, the flat surface may be formed parallel above the midline of the cylindrical tail diameter to increase the resulting combined thickness of the assembly, creating additional interaction between the two plungers. In further embodiments the flat surface on the tail portion may be formed at either an angle to or in a helix about the midline of the cylindrical tail portion diameter.

In yet another embodiment, one plunger includes an essentially flat tail portion, centrally located along the axis of the component, and the opposite plunger has a mating slot which receives the flat tail portion of the opposite plunger. This design allows for two edges to be in slidable contact engagement, thus enhancing resistance performance.

Each of the plungers may be formed in a general cylindrical shape, suitable for lathe, screw machine or other similar manufacturing equipment. Alternatively the plunger may be formed in a generally flat shape, suitable for stamping, etching, photolithography or other similar manufacturing technique for creating substantially two dimensional geometries.

For generally flat shaped plungers, the plunger tail section may have a portion that extends beyond the opposite ends of the coils of the spring. This facilitates enhanced electrical contact and adds additional support to the opposite plunger tip or contact portion. The plunger tail portion that extends past the opposite end of the spring can have the edges on one side reduced to provide for maximum material utilization. A slot may also be provided in the spring interference area of the flat pattern version of the plunger to provide additional compliance, absorbing tolerance while providing a reliable press fit. Flat plunger designs also can benefit from having the plungers generally sliding together at an inclined configuration, thus transferring some of the axial forces supplied by the external helical spring to a perpendicular direction, which is normal to, mating plunger surfaces. This normal surface force enhances intimate electrical contact between the components. Methods for maintaining the probe together include enlarged tail portions extending past reduced diameter center coils and interlocking tabs on the contact portions. Kelvin configurations are also possible having two separate electrical paths isolated from one another within a single probe.

Further benefits provided by flat geometry allow multiple plungers to be easily fabricated as part of a lead frame assembly, facilitating plating and assembly in high volumes. Completed assemblies can also be supplied attached to a lead frame, making it easier for the end user to load the probe assembly into a finished test fixture or socket. Tip configurations can be single point, multiple point or three dimensional.

The present invention also contemplates a spring contact assembly having a cylindrical plunger in combination with a flat plunger. This hybrid combination can provide for cylindrical tip geometries to address sufficient testing for solder ball or other geometries while reducing the manufacturing costs for a fully cylindrical contact assembly by incorporating a flat plunger as the opposite plunger. These and other aspects of the present invention will be more fully understood with reference to the detailed description in combination with the drawings.

BRIEF DESCRIPTION OF THE DRAWINGS

FIG. 1 is a perspective view of the spring contact assembly of the present invention;

FIG. 2 is a side view of a first plunger of the spring contact assembly of FIG. 1;

FIG. 3 is a side view of an alternative plunger design of the present invention;

FIG. 4 is a side view of a second plunger of the spring contact assembly of FIG. 1;

FIG. 9 is an axial cross-sectional view of the spring contact assembly of FIG. 1 inserted into a test socket;

FIG. 10 is a perspective of an alternative embodiment spring contact assembly of the present invention;

FIG. 11 is a side view of one plunger of the spring contact assembly of FIG. 10;

FIG. 12 is a schematic illustration of a stamping procedure for the plunger of FIG. 11;

FIG. 13 is a side view of a second plunger of the spring contact assembly of FIG. 10;

FIG. 14 is a cross-sectional view of the spring contact assembly of FIG. 10;

FIG. 26 is a perspective view of an alternative contact tip design; and

FIG. 27 is a perspective view of FIG. 26 illustrating a three dimensional contact tip.

DETAILED DESCRIPTION OF THE INVENTION

Figure 5:
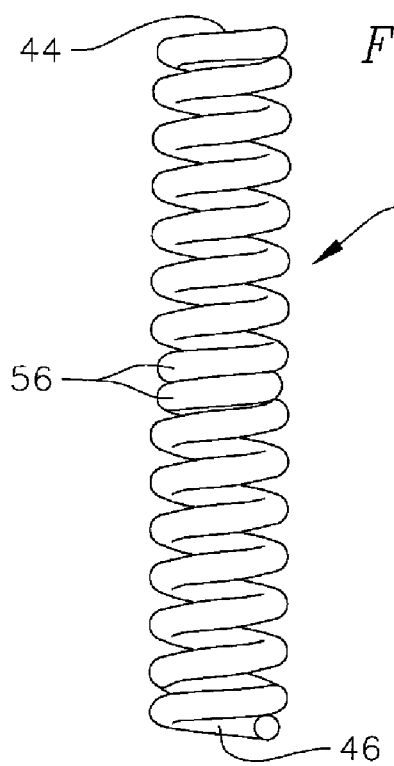
FIG. 5 is a side view of a spring of the spring contact assembly of FIG. 1.

FIGS. 1-11 illustrate a first embodiment spring contact assembly 10 of the present invention. The spring contact assembly 10 includes a first contact member or plunger 12, a second contact member or plunger 14, and a spring 16. As shown in FIG. 2, plunger 12 includes a contact portion 18 and a tail portion 20. A contact tip 22 is positioned at an end of the contact portion 18 and can have multiple contact geometries as also shown in FIG. 3 and FIG. 4. A flange 24 is positioned between contact portion or section 18 and tail portion or section 20. Flange 24 has a flat face 26 used for aligning the probe during assembly. The plunger tail portion 20 has a cylindrical surface 28 and a flat surface 30 extending along its length.

Plunger 14 as shown in FIG. 4 also includes a contact portion or section 32 and a tail portion or section 34. A flange 36 is positioned between contact section 32 and tail section 34 and also includes a flat surface 38 for positioning plunger 14 during assembly. Tail section 34 has a cylindrical surface 40 and a flat surface 42 extending along its length. Flat surfaces 30 and 42 pass over one another and make contact inside of spring 16 when assembled, as also seen in FIG. 9. Flat surfaces 30 and 42 increasingly engage one another during compression of the assembly.

Figure 6:
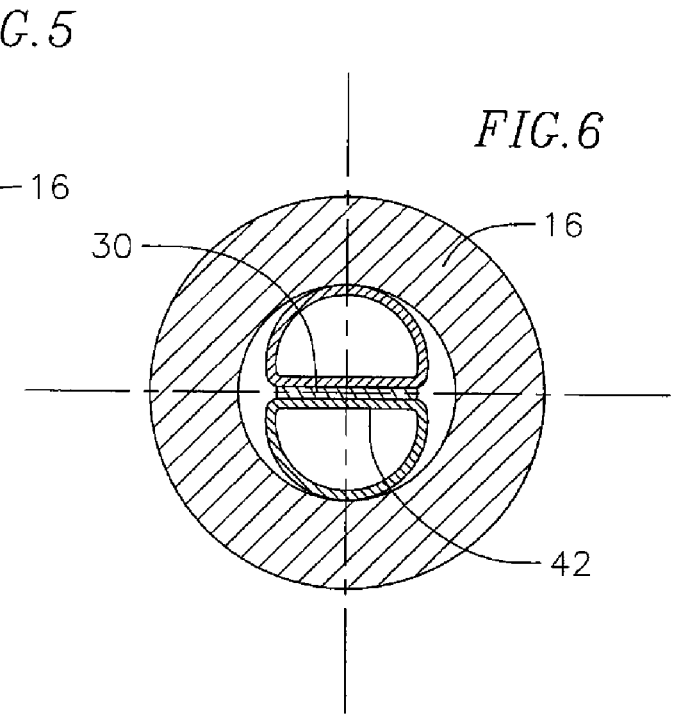
FIG. 6 is a cross-sectional view of the spring contact assembly of FIG. 1.

As shown in FIG. 5 the spring 16 has end coils 44 and 46 at opposite ends of the spring that press onto plunger tail sections 20 and 34 at cylindrical sections 48 and 50 adjacent flanges 24 and 36. The end coils 44 and 46 have a slightly smaller diameter and therefore firmly grip cylindrical sections 48 and 50 to prevent the plungers from separating from the spring, thus fixing the plunger tips 22 and 52 and flat surfaces 30 and 42 with respect to each spring end. Utilizing the natural torsional movement of the spring 16 while it is compressed, the flat portions 30 and 42 of the plungers maintain contact throughout the entire stroke of the probe as also shown in FIG. 6. The contact between the opposing flat sections prevents twisting or torsional movement from translating it to the spring contact tips 22 and 52. The opposition to the natural twisting enhances the electrical conductivity of the components, which in turn improves the performance of the contact.

The flat section 30 as shown in FIGS. 2 and 3 can be formed parallel at the midline of the cylindrical tail portion diameter for each plunger or the flat section 42 may be formed parallel above the midline 54 of the cylindrical tail diameter for each plunger as shown in FIG. 4 to increase the resulting combined thickness of the assembly, creating additional interaction between two plungers in an assembly. Although FIGS. 1-4 show three different plunger tip designs, it is to be understood that any plunger tip design could be utilized depending upon its particular application. To further constrain the tail sections 20 and 34 and enhance the interaction between the two plungers, the spring 16 can employ reduced coil sections 56 as shown in FIG. 5. Further biasing effect can also be created by offsetting coil sections 56.

Figure 7:
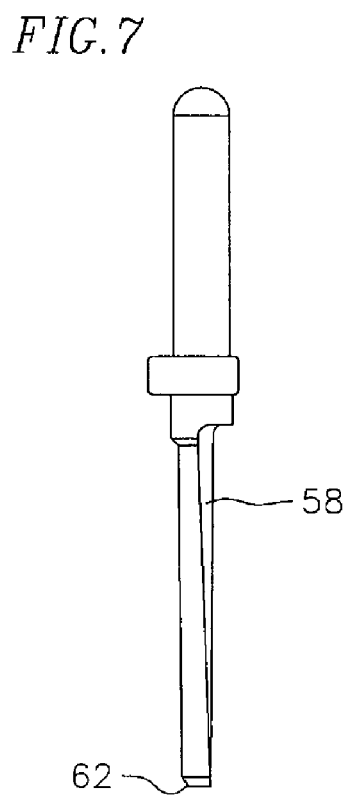
FIG. 7 is a side view of an alternative plunger design of the present invention.
Figure 8:
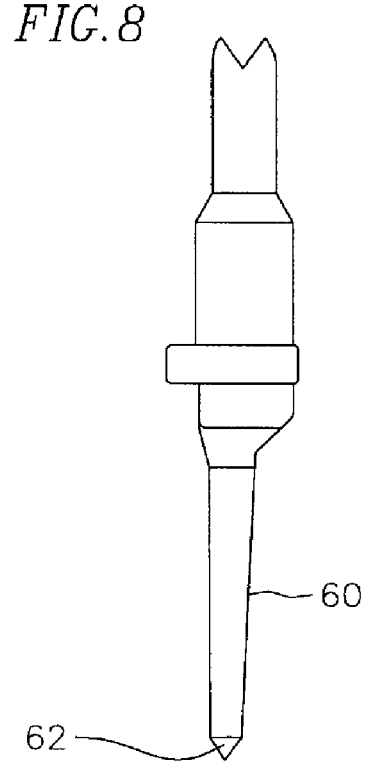
FIG. 8 is a side view of an alternative plunger design of the present invention.

Alternative designs for the plunger tail section can include the flat surface 58 formed in a helix about the midline of the cylindrical tail diameter as shown in FIG. 7 or the flat section 60 may be formed at an angle to the midline of the cylindrical tail diameter as shown in FIG. 8. As with all of the various plunger designs, the tail section may have a reduced end section 62 that allows the spring to be threaded onto the tail portion before being press fit on the reduced diameter section adjacent the flange. The reduced section 62 allows the plunger to pilot into the spring, easing the assembly process. As previously indicated, the cylindrical sections 48 and 50 of the plunger tails creates an interference fit with the end coils of the spring and the gripping force created between the cylindrical sections and the end coils is sufficient to keep the assembly together during normal handling and use and in combination with the flat surfaces resist normal torsional forces applied by the spring. The generally cylindrical plunger designs of FIGS. 1-9 are manufactured by machinings such as a lathe, screw machine or other similar manufacturing equipment.

An alternative spring contact assembly 70 is illustrated in FIGS. 10-15. Spring contact assembly 70 includes two movable and overlapping plungers 72 and 74 surrounded by an external spring 76. Plungers 72 and 74 are formed in a generally flat shape, suitable for stamping, etching, photolithography or other similar manufacturing technique for creating substantially two-dimensional geometries as generally referenced as 78 in FIG. 12. An additional benefit of flat plunger geometry allows multiple plungers to be easily fabricated as a part of a lead frame assembly, facilitating plating and assembly in high volume. Completed assemblies can also be supplied attached to a lead frame, making it easier for the end user to load the probe assembly into a finished test fixture or socket 110 (shown in FIG. 9).

Plunger 72 includes a contact portion or section 80 and a tail portion or section 82. Contact section 80 includes a contact tip 84 which can be any of a number of geometrical configurations. Considering the entire plunger has a flat configuration, plunger tail section 82 includes a flat surface 86. A flange 88 is positioned between contact section 80 and tail section 82. Tail section 82 includes an enlarged portion 90 for creating an interference fit with end coils of the spring 76 to retain the spring contact in its assembled configuration. Mating plunger 74 also includes a contact portion or section 92, a tail portion or section 94, and a flange 96 positioned between the contact section and tail section. Tail section 94 includes an enlarged portion 98 for creating an interference fit with the end coils of spring 76.

In the flat configuration spring contact assembly 70, the plunger tail sections 82 and 94 may have an end portion 100 that extends past the end coils of the spring as shown in FIG. 10. This design enhances the electrical contact between the plungers and adds support to the opposite plunger tip. One or both of the plunger tails can extend beyond the end coils for a particular application. As shown in FIG. 11 and FIG. 14 the end portion 82 which may extend beyond the end coils of the spring may have the corner edges 102 removed allowing for maximum material utilization.

Figure 15:
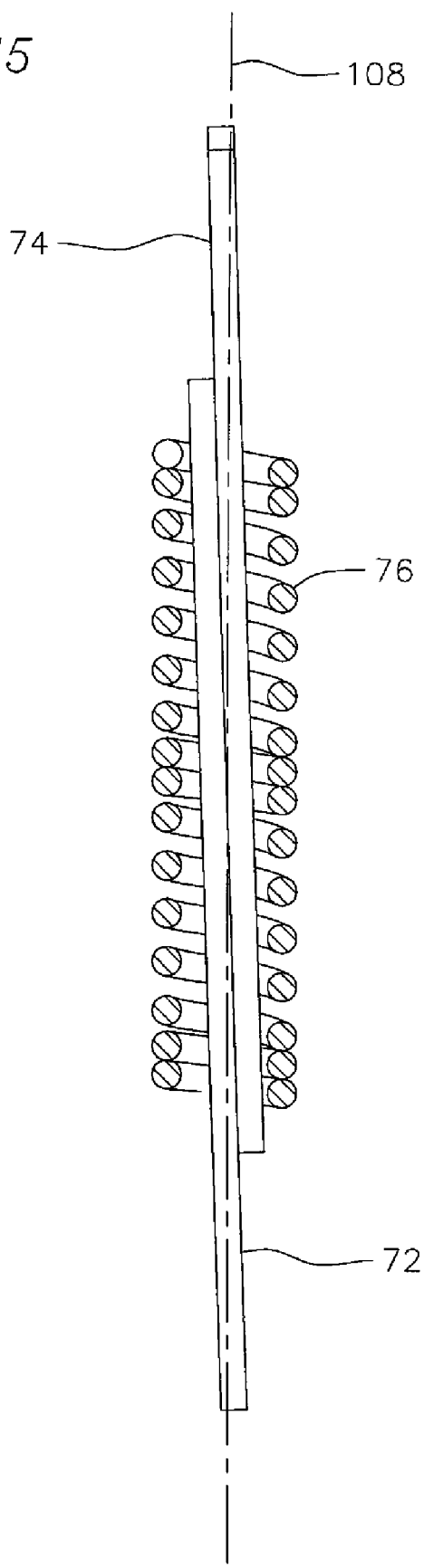
FIG. 15 is an axial cross-sectional view of an alternative spring contact assembly of FIG. 10.

As shown in FIG. 13 plunger 74 may include a slot 106 in the spring interference area of the plunger to provide additional compliance, absorbing tolerance while providing a reliable press fit for the end coil. As shown in FIG. 15 the flat plunger design benefits from the new result of having the plungers 72 and 74 generally sliding together in an inclined configuration with respect to a midline axis 108. The plungers sliding together at an incline configuration transfers some of the axial forces supplied by the external helical spring 76 to a perpendicular direction, or normal to, the mating flat plunger surfaces. The normal force enhances intimate electrical contact between the plungers as shown in FIG. 15.

Figure 16:
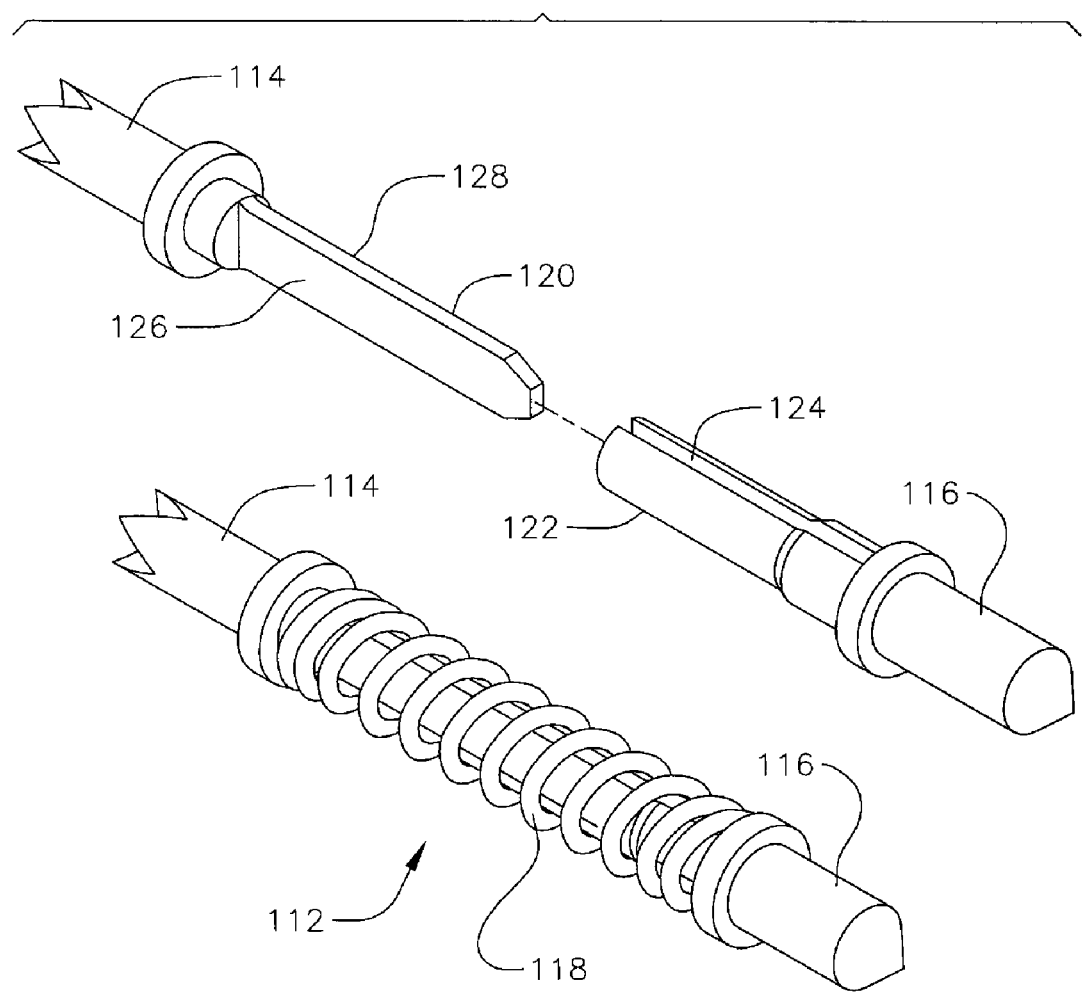
FIG. 16 is a perspective view of an alternative spring contact assembly of the present invention.

Yet another alternative embodiment spring contact assembly 112 is shown in FIG. 16 comprising mating plungers 114 and 116 and an external helical spring 118. In this configuration, plunger 114 has a flat tail portion 120 and plunger 116 has a tail portion 122 having a feature with internally opposed flat surfaces 124 for receipt of flat tail 120. Tail portion 120 is centrally located along the axis of plunger 114 and the feature 124 is centrally located along the axis of plunger 116. Spring contact assembly 112 allows for two flat edges 126 and 128 to be received in slidable contact with flat edges within feature 124. This design provides for enhances resistance performance of the spring contact assembly.

Figure 17:
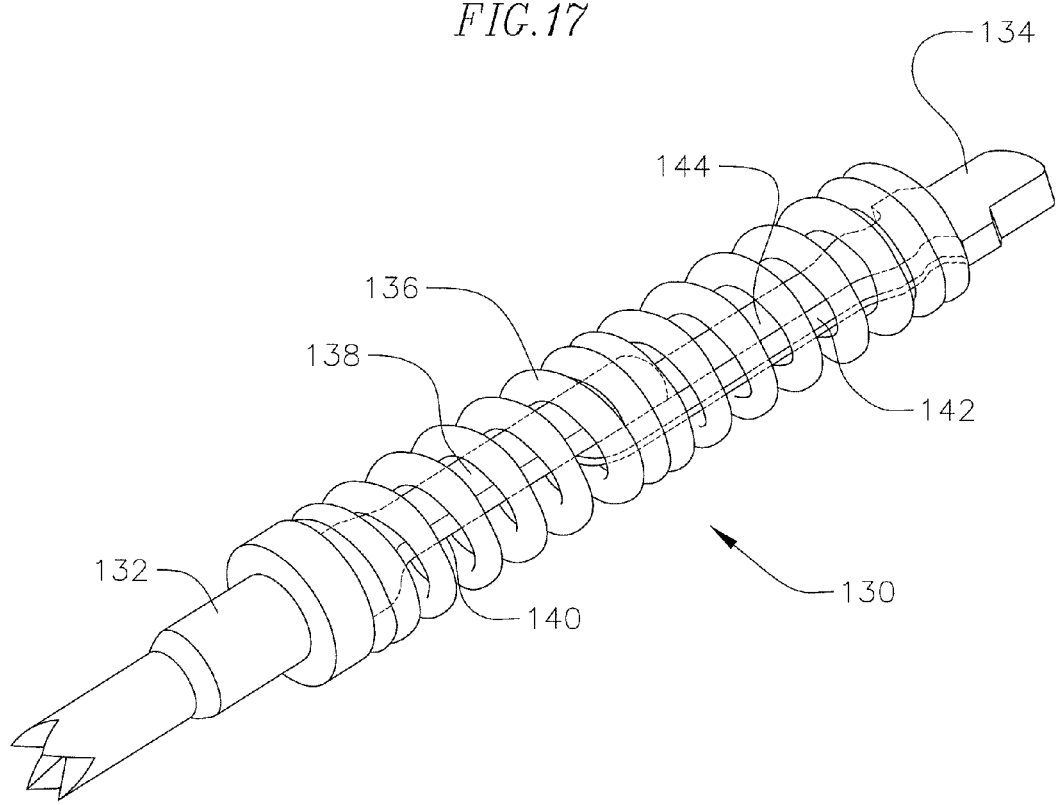
FIG. 17 is a perspective view of another alternative embodiment spring contact assembly of the present invention.

FIG. 17 illustrates yet another alternative embodiment spring contact assembly 130 which is a hybrid combination of the spring contact assemblies of FIGS. 1 and 10. Spring contact assembly 130 has a cylindrical plunger 132 and a flat plunger 134 in slidable contact within an external helical spring 136. Tail portion 138 of plunger 132 has a flat surface 140, and tail portion 142 of plunger 134 also has a mating flat surface 144. Flat surfaces 140 and 144 are in slidable engagement.

Figure 18:
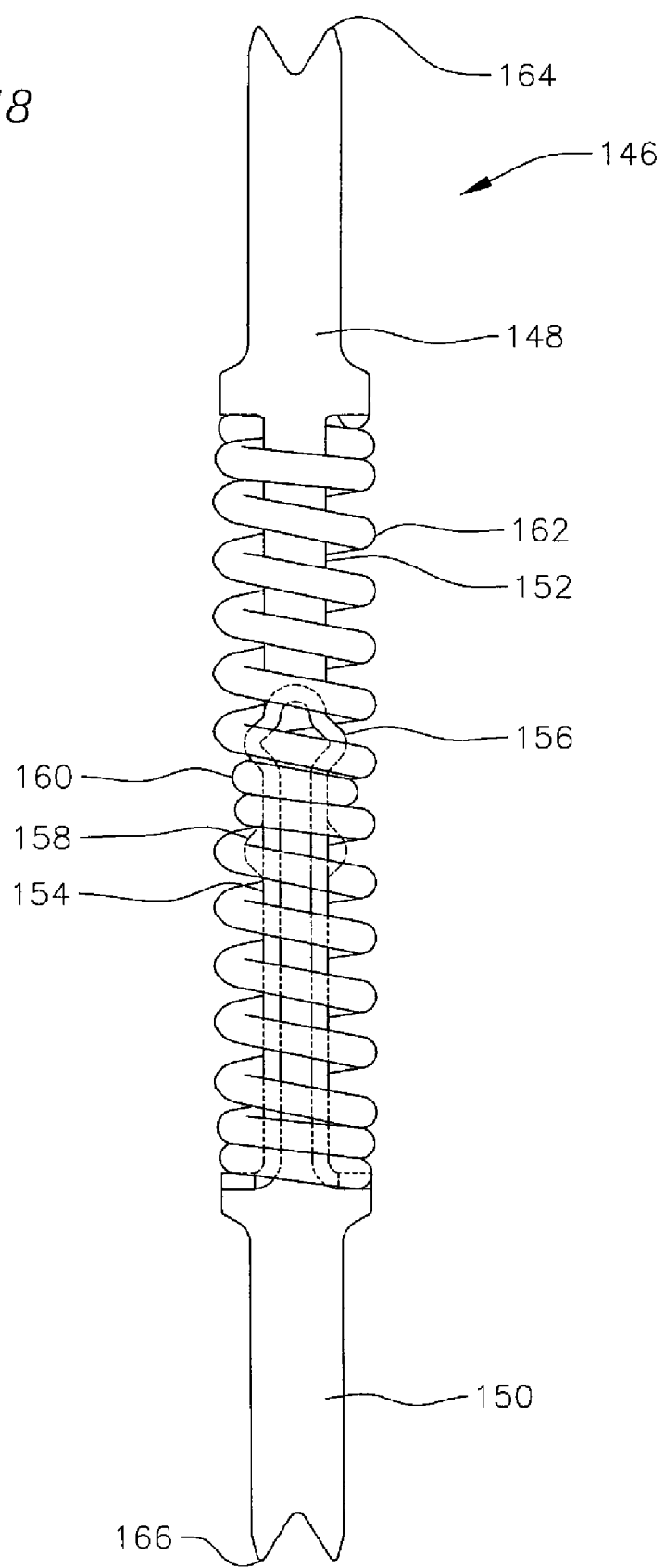
FIG. 18 is a side view of another alternative embodiment spring contact assembly of the present invention.

FIG. 18 illustrates another alternative embodiment spring contact assembly 146 of the present invention. The spring contact assembly 146 is a flat configuration having a first contact member 148 and a second contact member 150. Each of the tail portions 152 and 154 of contact members 148 and 150 include an enlarged tail section 156 and 158 which pass through reduced diameter center coil sections 160 of helical spring 162. The enlarged tail portions are opposite contact tips 164 and 166 of each contact member. The enlarged tail section passes through the reduced diameter coils and the force of the spring is sufficiently low such that the contact members do not disengage from the spring.

Figure 19:
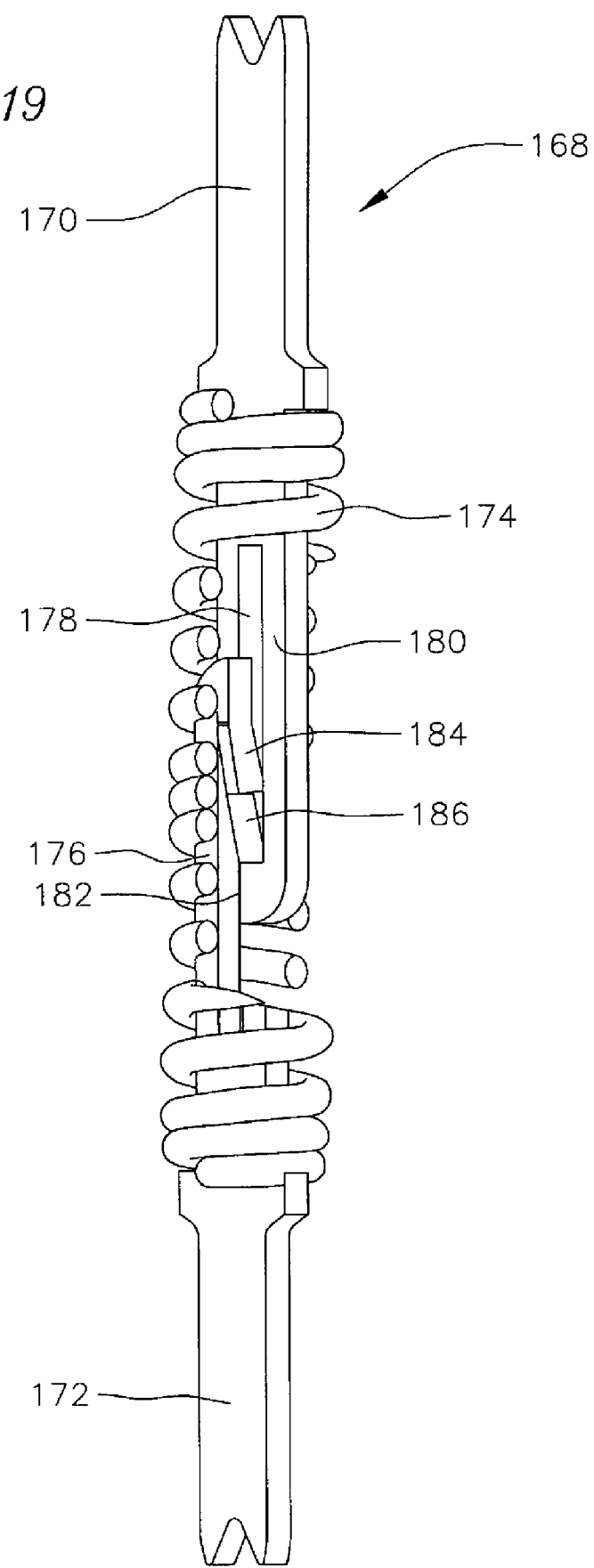
FIG. 19 is a perspective view of another alternative embodiment spring contact assembly of the present invention.

FIG. 19 illustrates another alternative embodiment spring contact assembly 168 which illustrates another alternative method for retaining contact members 170 and 172 to helical spring 174. In this embodiment, the center sections 176 and 178 of tail portions 180 and 182 respectively, are pierced through forming a tab 184, 186, which when contact members 170 and 172 are assembled within the spring 174, the tabs interlock.

Figure 20:
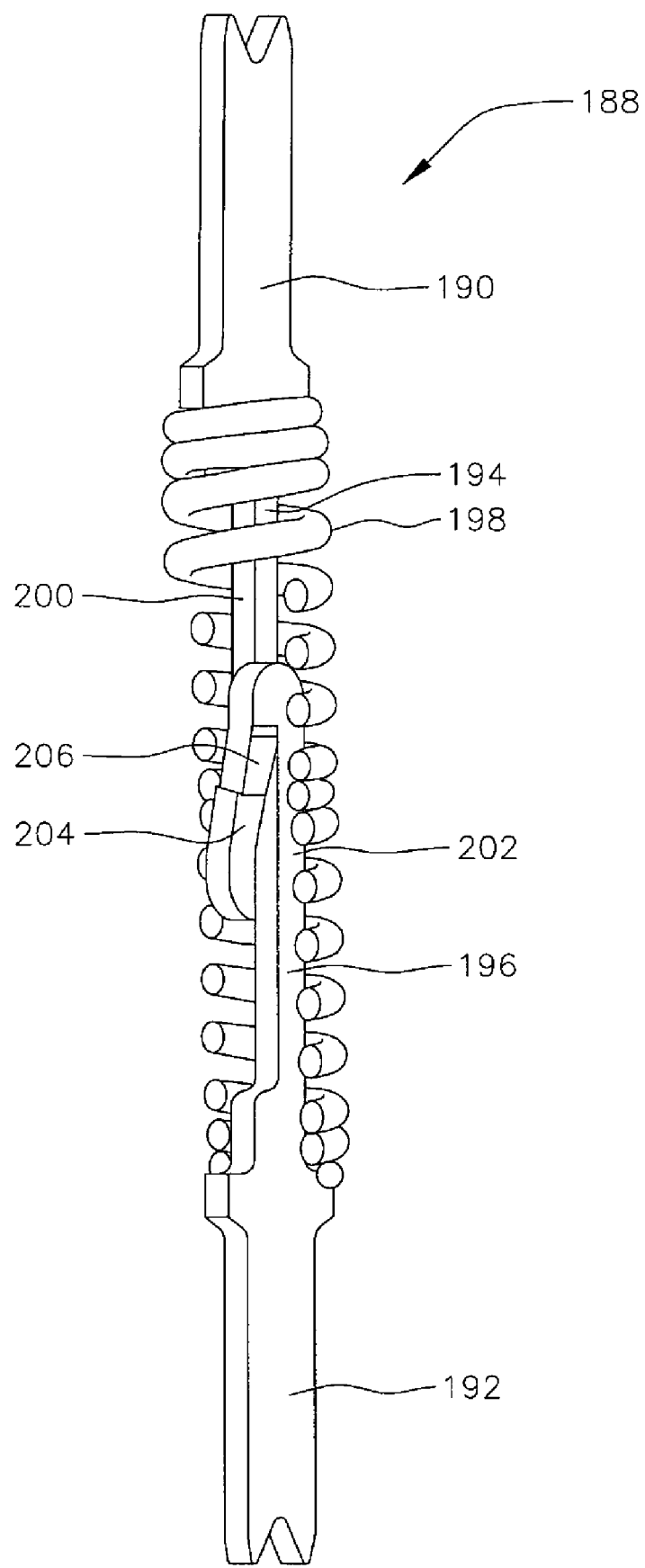
FIG. 20 is a perspective view of another alternative embodiment spring contact assembly of the present invention.

FIG. 20 illustrates another alternative spring contact assembly 188 which illustrates another alternative for connecting the contact members. Assembly 188 includes a first contact member 190 and a second contact member 192 having tail portions 194 and 196 positioned within a helical spring 198. The center section 200 and 202 of the tail portions have a non-centered tab 204 and 206 which when assembled interlock. Tabs 204, 206 are formed by a forming or folding operation.

Figure 21:
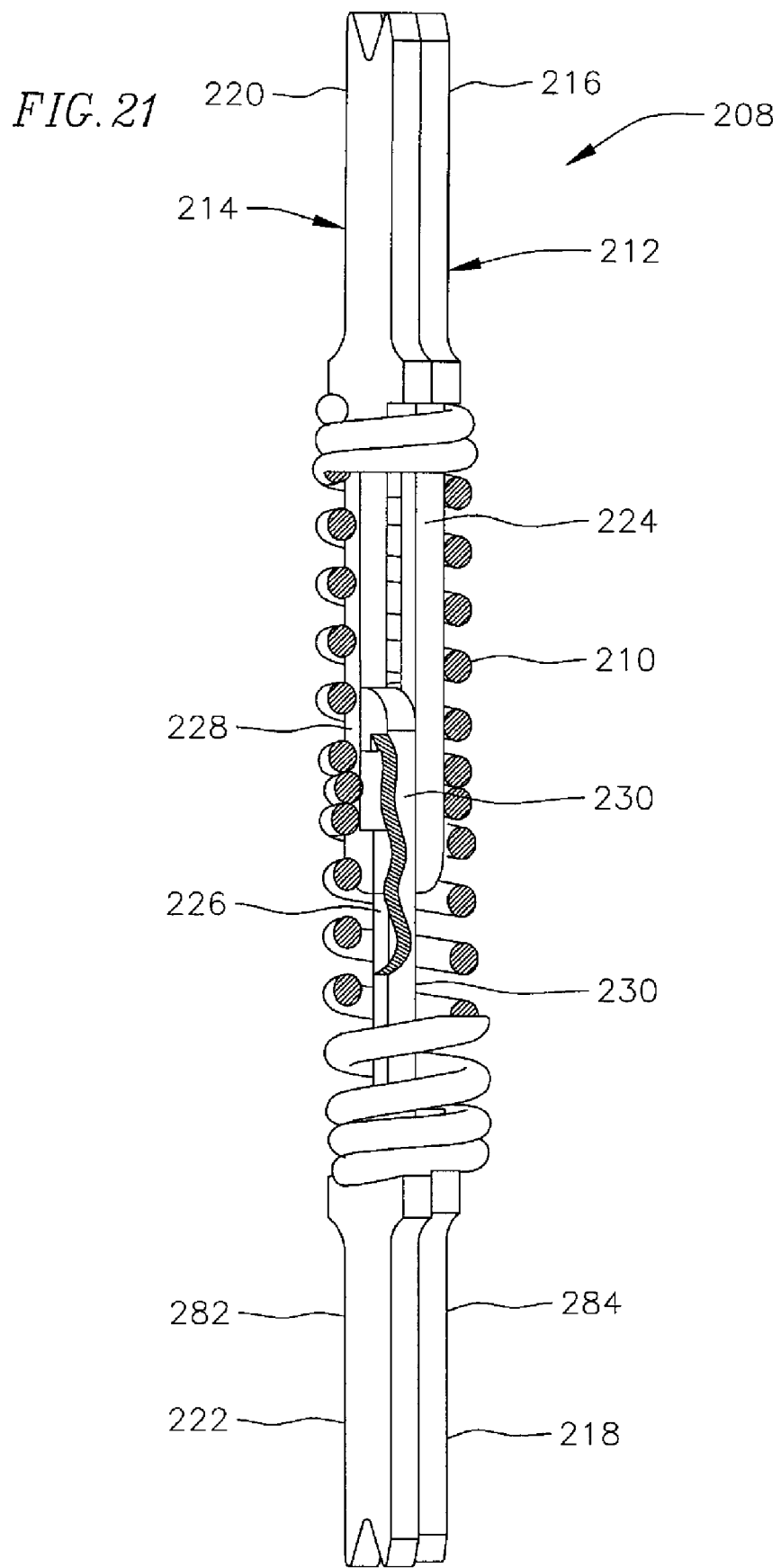
FIG. 21 is a perspective view of another alternative embodiment Kelvin measurement spring contact assembly of the present invention.

FIG. 21 illustrates yet another alternative embodiment spring contact assembly 208 which is a Kelvin measurement configuration. Assembly 208 has two separate electrical paths within a single spring 210. This is accomplished by having two separate contact members 212 and 214 adjacent one another. Members 212 and 214 are electrically isolated from each other and from spring 210 by having a non-conductive coating positioned upon adjacent surfaces. Contact member 212 has a first contact segment 216 and a second contact segment 218. Similarly, contact member 214 has a first contact segment 220 and a second contact segment 222. Each of segments 216 through 222 have a tail portion 224, 226, 228 and 230, respectively. Tail portions 224, 226, 228 and 230 have conductive surfaces 232 such that only sections 224 and 226 electrically communicate with one another and only sections 228 and 230 electrically communicate with one another. Tail sections 224 through 230 are positioned within spring 210. Assembly 208 has two separate electrical paths within a single spring wherein each contact path consists of two slidably engaging tail portions and each contact path is electrically isolated from its neighboring contact path.

Figure 22:
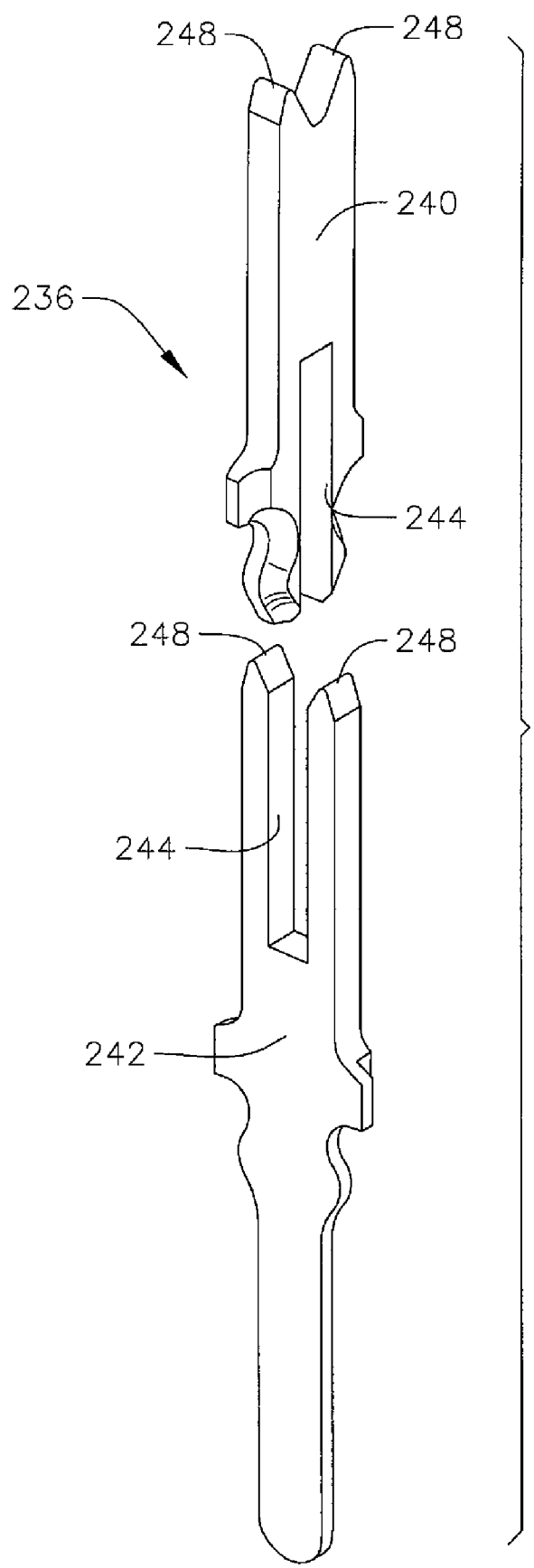
FIG. 22 is a perspective view of three dimensional contact tip embodiment of the present invention.
Figure 23:
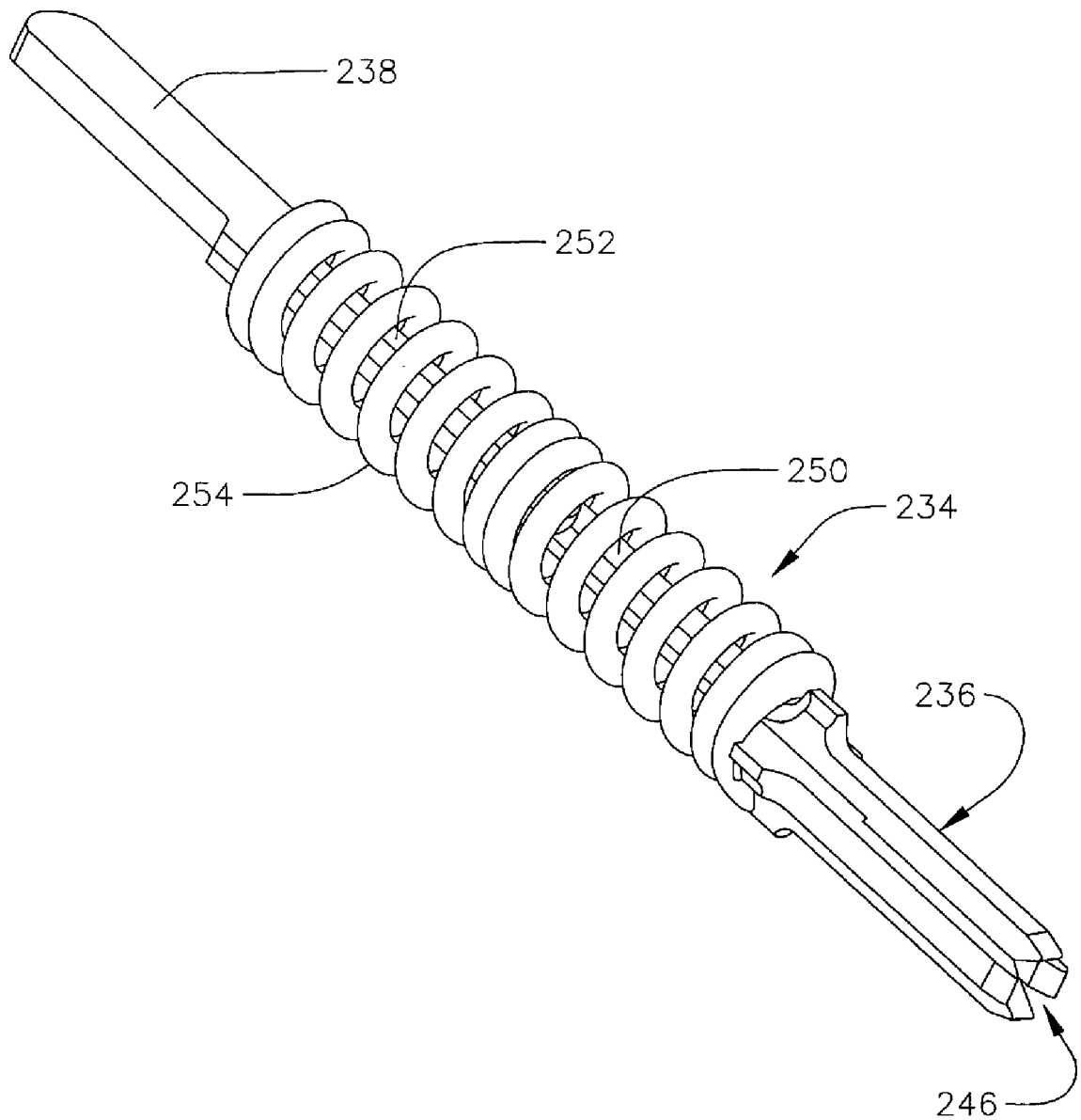
FIG. 23 is a perspective view of a spring contact assembly with the tip configuration of FIG. 22.

FIGS. 22 and 23 disclose another alternative embodiment spring contact assembly 234 having a first contact member 236 and a second contact member 238. Contact member 236 includes sections 240 and 242 each having a slot 244 so that sections 240 and 242 can engage one another to create a three dimensional contact tip 246. Contact tip 246 comprises four contact points 248. Sections 240 and 242 are illustrated as being connected perpendicularly, however, it is to be understood that slots 244 can be machined such that the two sections can be assembled at an angle other than perpendicular. Contact section 236 and contact section 238 have tail portions 250 and 252 which are positioned within spring 254.

Figure 24:
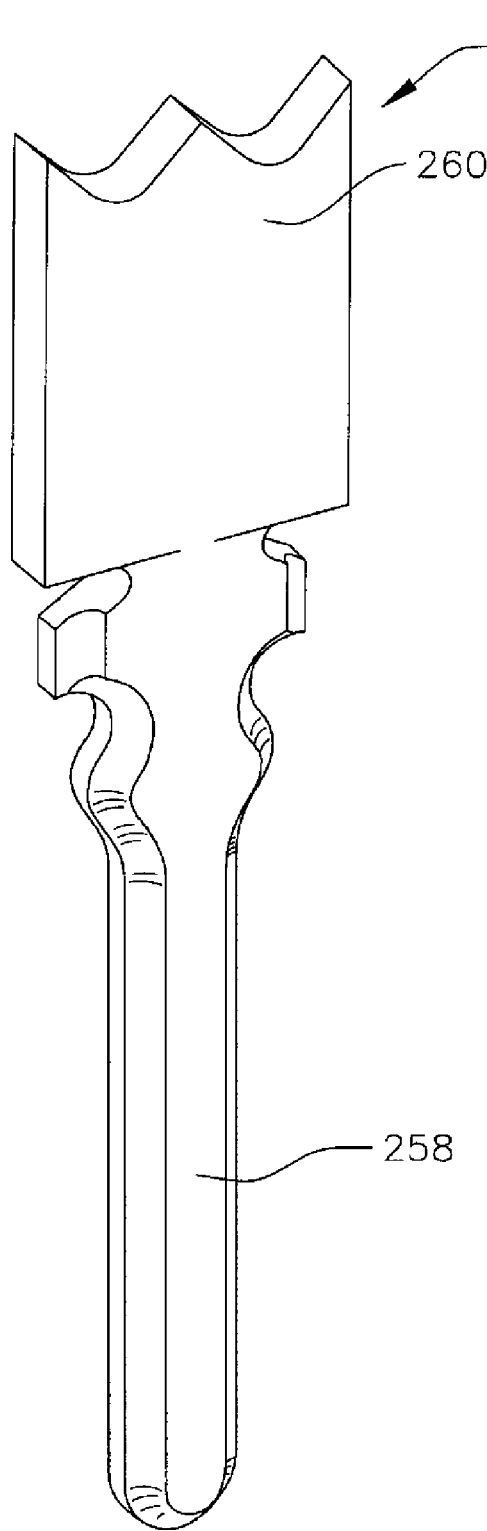
FIG. 24 is a perspective view of an alternative contact tip design of the present invention.
Figure 25:
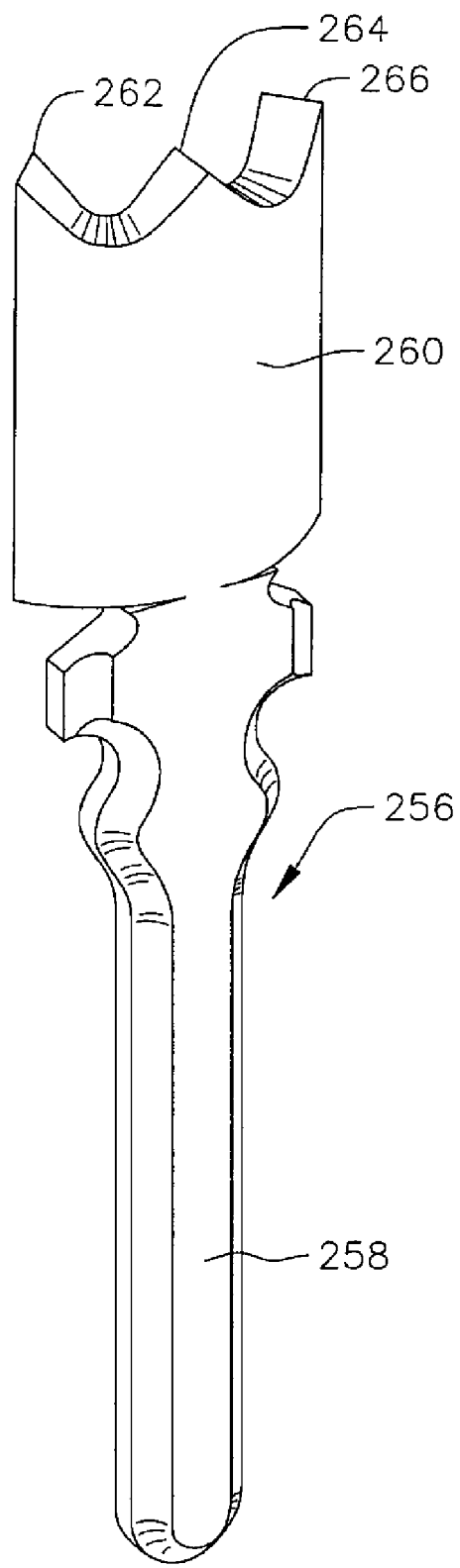
FIG. 25 is a perspective view of FIG. 24 illustrating a three dimensional contact tip.

FIGS. 24 and 25 illustrate an alternative embodiment three dimensional contact tip configuration. Contact member 256 includes a tail portion 258 and a contact tip portion 260. Contact member 256 is a flat configuration as shown in FIG. 24 and contact tip 260 can have a three dimensional configuration as shown in FIG. 25 by bending or otherwise deforming the flat contact tip into a three dimensional shape. It is to be understood that the contact tip configuration although illustrated with three contact points 262, 264 and 266 can have any number of contact points depending upon the particular application. The tip geometry can be V-shaped, U-Shaped or other shapes to transform an otherwise two dimensional contact tip into a three dimensional contact tip. This can be done by bending or other forming type operations. Similarly, FIGS. 26 and 27 illustrate yet another alternative three dimensional contact tip design for contact member 268. Contact member 268 initially is formed in a flat two dimensional configuration as shown in FIG. 26 wherein contact member 268 includes a tail portion 270 and a contact tip portion 272. As shown in FIG. 27, contact tip portion 272 is folded upon itself to form the three dimensional configuration. In this embodiment, four contact points 274, 276, 278 and 280 are illustrated.

Although the present invention has been described and illustrated with respect to several embodiments thereof it is to be understood that changes and modifications can be made therein which are within the full scope of the invention as hereinafter claimed.

What is claimed is:

1. A spring contact assembly comprising:
    a first contact member having a tail portion having a flat contact surface along a length of the tail portion;
    a second contact member having a tail portion having a flat contact surface along a length of the tail portion; and
    a compression spring having a reduced diameter coil section attached to the first contact member tail portion and the second contact member tail portion,
    whereby the flat contact surface of the tail portion of the first contact member slidably engages the flat contact surface of the tail portion of the second contact member and increases in contact surface area of the flat contact surfaces during compression of the spring to overcome a torsional spring force on the first contact member and the second contact member;
    wherein the flat contact surface on the tail portions of the first contact member and the second contact member is parallel and above a midline of a cylindrical tail portion diameter.

2. The assembly of claim 1 wherein the spring includes reduced diameter end coils which engage the tail portions.

3. The assembly of claim 1 wherein the spring includes reduced diameter center coil section which engages the tail portions.

4. The assembly of claim 1 wherein at least one of the first contact member and the second contact member is cylindrical.

5. The assembly of claim 4 wherein both the first contact member and the second contact member is cylindrical.

6. A spring contact assembly comprising:
    a first contact member having a tail portion having a flat contact surface along a length of the tail portion;
    a second contact member having a tail portion having a flat contact surface along a length of the tail portion; and
    a compression spring having a reduced diameter coil section attached to the first contact member tail portion and the second contact member tail portion,
    whereby the flat contact surface of the tail portion of the first contact member slidably engages the flat contact surface of the tail portion of the second contact member and increases in contact surface area of the flat contact surfaces during compression of the spring to overcome a torsional spring force on the first contact member and the second contact member;
    wherein the flat contact surface on the tail portions of the first contact member and the second contact member is parallel and above a midline of a cylindrical tail portion diameter; and
    wherein the flat contact surface on the tail portions of the first contact member and the second contact member is formed at an angle to a midline of a cylindrical tail portion diameter.

7. A spring contact assembly comprising:
    a first contact member having a tail portion having a flat contact surface along a length of the tail portion;

a second contact member having a tail portion having a flat contact surface along a length of the tail portion; and a compression spring having a reduced diameter coil section attached to the first contact member tail portion and the second contact member tail portion, whereby the flat contact surface of the tail portion of the first contact member slidably engages the flat contact surface of the tail portion of the second contact member and increases in contact surface area of the flat contact surfaces during compression of the spring to overcome a torsional spring force on the first contact member and the second contact member;

wherein the flat contact surface on the tail portions of the first contact member and the second contact member is parallel and above a midline of a cylindrical tail portion diameter; and wherein the flat surface on the tail portions of the first contact member and the second contact member is formed in a helix about a midline of a cylindrical tail portion diameter.

8. A spring contact assembly comprising:
a first contact member having a tail portion having a flat contact surface along a length of the tail portion;
a second contact member having a tail portion having a flat contact surface along a length of the tail portion; and
a compression spring having a reduced diameter coil section attached to the first contact member tail portion and the second contact member tail portion,
whereby the flat contact surface of the tail portion of the first contact member slidably engages the flat contact surface of the tail portion of the second contact member and increases in contact surface area of the flat contact surfaces during compression of the spring to overcome a torsional spring force on the first contact member and the second contact member;
wherein both the first contact member and the second contact member are a flat configuration; and
wherein an end portion of the tail portions of the first or second contact members extend beyond an end coil of the compression spring when the contact assembly is compressed.

9. The assembly of claim 8, wherein an edge surface of the tail portion along the length of the tail portion opposite the flat contact surface is removed.

10. A spring contact assembly comprising:
a first contact member having a tail portion having a flat contact surface along a length of the tail portion;
a second contact member having a tail portion having a flat contact surface along a length of the tail portion; and
a compression spring having a reduced diameter coil section attached to the first contact member tail portion and the second contact member tail portion,
whereby the flat contact surface of the tail portion of the first contact member slidably engages the flat contact surface of the tail portion of the second contact member and increases in contact surface area of the flat contact surfaces during compression of the spring to overcome a torsional spring force on the first contact member and the second contact member; and
wherein at least one of the first contact member or the second contact member includes a slot in the tail portion.

11. A spring contact assembly comprising:
a first contact member having a tail portion having a flat contact surface along a length of the tail portion;
a second contact member having a tail portion having a flat contact surface along a length of the tail portion; and
a compression spring having a reduced diameter coil section attached to the first contact member tail portion and the second contact member tail portion,
whereby the flat contact surface of the tail portion of the first contact member slidably engages the flat contact surface of the tail portion of the second contact member and increases in contact surface area of the flat contact surfaces during compression of the spring to overcome a torsional spring force on the first contact member and the second contact member; and
wherein the tail portion of the first contact member is flat and the tail portion of the second contact member has two internally opposed flat surfaces for receiving the tail portion of the first contact member.

12. A spring contact assembly comprising:
a first flat contact member having a tail portion having a contact surface along a length of the tail portion;
a second flat contact member having a tail portion having a contact surface along a length of the tail portion; and
a compression spring attached to the first flat contact member tail portion and the second flat contact member tail portion,
whereby the contact surface of the tail portion of the first flat contact member slidably engages the flat contact surface of the tail portion of the second flat contact member at an inclined configuration which increases the sliding engagement and contact surface area of the flat contact surfaces during compression of the spring by transferring axial forces supplied by the spring normally to the sliding surfaces.

13. The assembly of claim 12 wherein the first contact member has a three dimensional contact tip.

14. The assembly of claim 12 wherein the spring includes reduced diameter end coils which engage the tail portions.

15. The assembly of claim 14 wherein the tail portions have interlocking tabs.

16. The assembly of claim 12 wherein the spring includes reduced diameter center coils which engage the tail portions.

17. The assembly of claim 16 wherein the tail portions have an enlarged end section which passes through the reduced diameter center coils.

18. A spring contact assembly comprising:
a first flat contact member having a tail portion having a contact surface along a length of the tail portion;
a second flat contact member having a tail portion having a contact surface along a length of the tail portion wherein the contact surface of the tail portion of the second flat contact member slidably engages the contact surface of the tail portion of the first flat contact member;
a third flat contact member having a tail portion having a contact surface along a length of the tail portion;
a fourth flat contact member having a tail portion having a contact surface along a length of the tail portion wherein the contact surface of the tail portion of the fourth flat contact member slidably engages the contact surface of the tail portion of the third flat contact member; and
a single compression spring is attached to and surrounds the tail portions of the first, second, third and fourth flat contact members,
whereby the first flat contact member and the second contact member are adjacent and parallel to the third contact member and the fourth contact member and electrically isolated from the third flat contact member and the fourth flat contact member such that there are two independent electrical paths within the assembly.

* * * * *